United States Patent [19]

Landis

[11] Patent Number: 4,673,904

[45] Date of Patent: Jun. 16, 1987

[54] MICRO-COAXIAL SUBSTRATE

[75] Inventor: Richard C. Landis, Shelton, Conn.

[73] Assignee: ITT Corporation, New York, N.Y.

[21] Appl. No.: 671,276

[22] Filed: Nov. 14, 1984

[51] Int. Cl.⁴ .......................... H01P 3/06; H01P 3/08
[52] U.S. Cl. .................................. 333/238; 333/243; 333/1; 174/68.5; 174/36; 174/117 PC; 29/829; 156/150
[58] Field of Search .................. 333/1, 238, 243, 246, 333/247; 174/36, 117 PC, 117 FF, 117 F, 68.5; 29/825, 828, 829, 842, 850, 846; 430/312, 319; 156/150, 901, 625, 629, 47, 48

[56] References Cited

U.S. PATENT DOCUMENTS

| 2,926,317 | 2/1960 | Blitz | 333/238 |
| 3,225,351 | 12/1985 | Chatelain et al. | 333/238 X |
| 3,243,498 | 3/1966 | Allen et al. | 174/68.5 |
| 3,258,724 | 6/1966 | Walsh et al. | 333/238 |
| 3,368,112 | 2/1968 | Hellgren | 333/238 X |
| 3,391,454 | 7/1968 | Reimann | 174/68.5 X |
| 3,391,457 | 7/1968 | Reimann | 174/68.5 X |
| 3,398,232 | 8/1968 | Hoffman | 333/238 X |
| 3,613,230 | 10/1971 | Griff | 174/36 X |
| 3,649,274 | 3/1972 | Older et al. | 430/312 |
| 3,696,433 | 10/1972 | Killion et al. | 333/238 X |
| 3,768,048 | 10/1973 | Jones, Jr. et al. | 333/238 |
| 3,831,074 | 9/1974 | Griff | 174/36 X |
| 3,922,479 | 11/1975 | Older et al. | 174/68.5 |
| 4,159,222 | 6/1979 | Lebow et al. | 156/632 |
| 4,306,925 | 12/1981 | Lebow et al. | 156/150 |
| 4,488,125 | 12/1984 | Grentry et al. | 333/1 |

OTHER PUBLICATIONS

Chalman et al., "Multiple Functions of Blind Copper Vias in Polyimide Multilayer Structure" Fourth Anul Int'l Electronics Packaging Conf. Procedure; Balt. Md, 29–31, Oct. 1984.

Peter, A. E. et al., "Multilayer Circuit Fabrication"; *IBM Technical Disclosure Bulletin;* vol. 10, No. 4, Sep. 1967; pp. 359–360.

*Primary Examiner*—Eugene R. LaRoche
*Assistant Examiner*—Benny T. Lee
*Attorney, Agent, or Firm*—Peter C. Van Der Sluys

[57] ABSTRACT

A support board or substrate is disclosed for interconnecting various electronic components. One or more conductors are imbedded within the substrate for interconnecting the components. Each conductor is provided with shielding to permit the exchange of high frequency signals between the components without cross-coupled interference.

5 Claims, 11 Drawing Figures

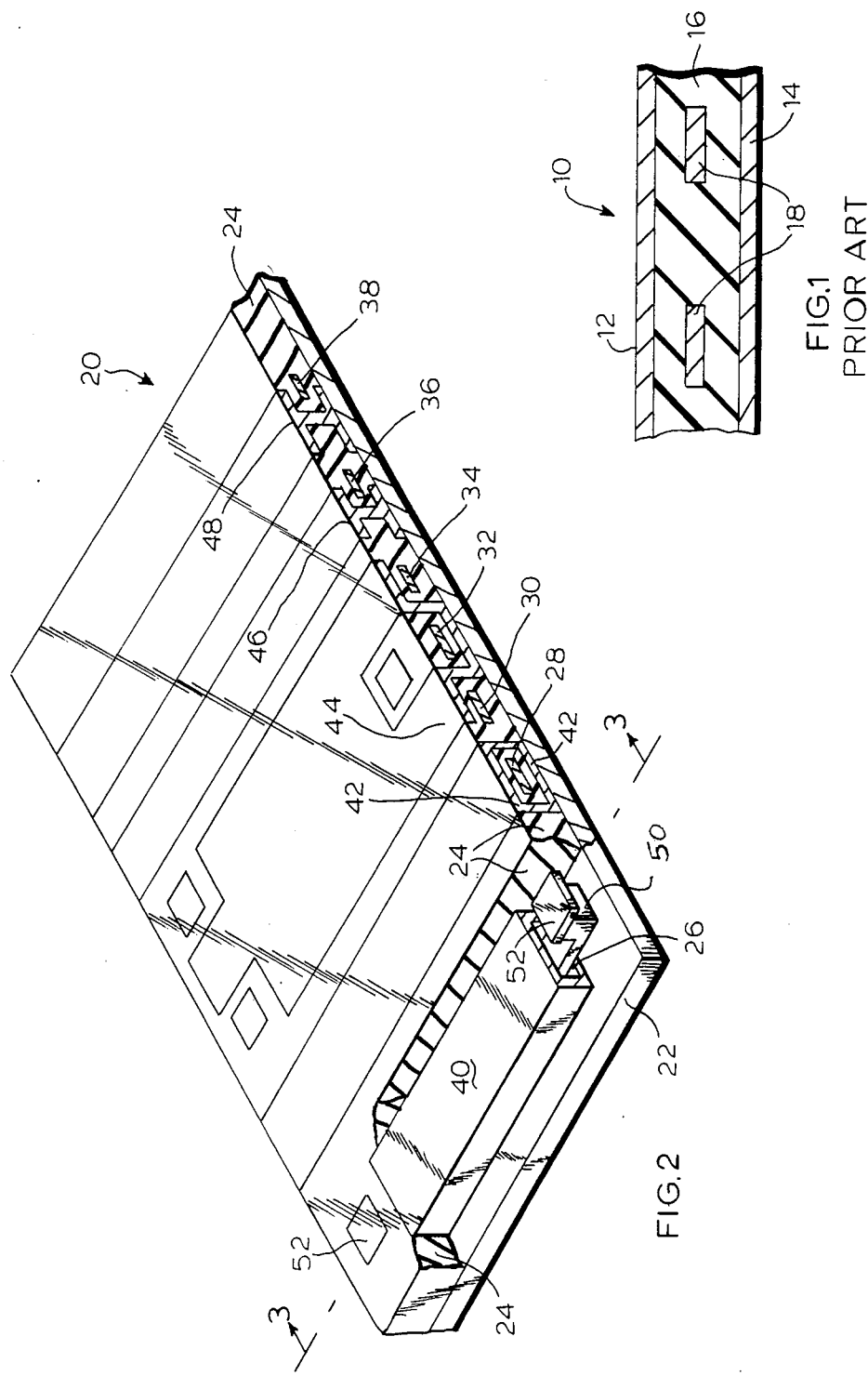

MICRO-COAXIAL SUBSTRATE

BACKGROUND OF THE INVENTION

1. Field of Invention

This invention relates to multilayered boards used for supporting and/or interconnecting various components of an electronic circuit, and more particularly to a method of making a board having a shielded conductor imbedded therein.

2. Description of the Prior Art

Typically miniaturized electronic circuits comprise several components such as transistors, resistors, capacitors, and so on as well as various integrated circuits (I.C.'s) which are mounted on a board. Interconnection between the different components is accomplished by providing a preselected strip pattern on the board by photomasking or other methods. However it is well-known that at high frequencies (i.e. in the Megahertz or Gigahertz range), the inductive and capacitance losses in these wires are prohibitive and furthermore the cross-coupling therebetween cause unacceptable distortions in the signals. Therefore it has been proposed that the components be interconnected by conductors imbedded in the board disposed between two parallel ground planes. However it is found that even with this configuration, cross-coupling between adjacent conductors occurs unless the conductors are spaced far apart. This spacing in turn required a proportionate increase in the size of the boards.

OBJECTIVES AND SUMMARY OF THE INVENTION

In view of the above, it is a principal objective of the present invention to provide a means for interconnecting high frequency electronic components which has a minimum size.

A further objective is to provide an interconnecting means in which capacitive, and inductive losses are minimized and cross-coupling is eliminated.

Another objective is to provide a method of producing said interconnecting means.

Other objectives and advantages of the invention shall become apparent from the following description. In accordance with this invention, a board for supporting and interconnecting various electronic components comprises a substrate in which a preselected pattern of conductors have been imbedded, each conductor being individually shielded. The substrate is formed by superimposing successive layers, each layer comprising one or more conductive lines and a dielectric material to generate a board with embedded shielded conductors.

BRIEF DESCRIPTION OF THE DRAWINGS

FIG. 1 shows a cross-sectional view of a prior art board having imbedded conductors interposed between two parallel ground planes;

FIG. 2 shows an isometric cross-sectional view of a board having shielded conductors constructed according to this invention;

DETAILED DESCRIPTION OF THE INVENTION

As shown in FIG. 1, a prior art board 10 comprised two parallel metallic sheets 12 and 14 which established two ground planes with a dielectric material 16 extending therebetween. A plurality of conductors, such as 18 are disposed between the two sheets as shown. As previously mentioned, at high frequencies capacitive-coupling between adjacent conductors causes signal interference. Thus a trade-off must be made between the maximum operation frequency of the board and the spacing between the conductors. This problem is obviated by the present invention, which, as shown in FIG. 2, provides an individual shield of each conductor.

Figure 3:
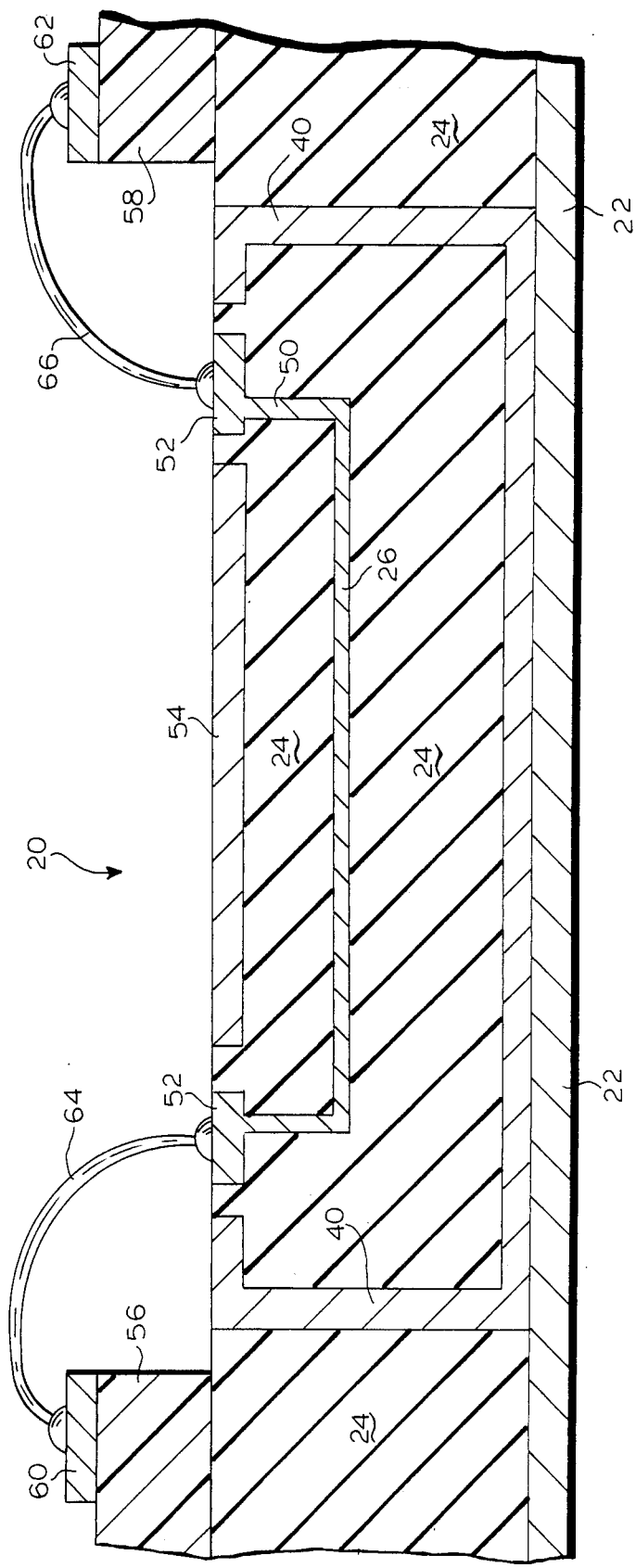
FIG. 3 shows a cross-sectional view of a typical conductor and its shield constructed in accordance with this invention.
Figure 4:
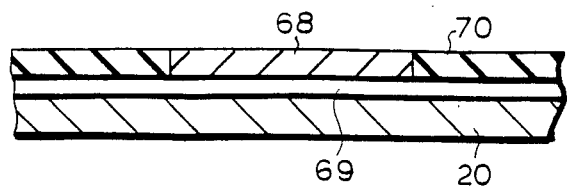
FIGS. 4-8 show how successive substrates are layered to form the board of FIG. 2.

The board 20 of FIGS. 2 and 3 comprises a metallic base 22 and a layer of dielectric material 24. Imbedded in the dielectric layer 24 are a plurality of conductors 26, 28, 30, 32, 34, 36 and 38. Depending on the required degree of isolation, some of the conductors such as 26 and 28 are completely shielded by tubular shields 40, and 42 respectively, having a rectangular cross-section. These shields are formed on the copper base so that they are electrically connected to the ground plane. The remaining conductors are partially shielded by U-shaped shield 44, or merely decoupled by the I-shaped isolating walls 46, 48.

For terminating purposes, the two extreme portions of each conductor comprise a vertical section 50 which ends in a square pad 52 flush with the top surface 54 of the board as shown in FIG. 3. Obviously connecting pads similar to pad 52 may be provided at intermediate locations as necessary. Thus the conductors may be readily used for interconnecting two or more devices. For example, two high frequency devices such as GaAs I.C.'s 56, 58 may be affixed to top surface 54 of board 20 as shown in FIG. 3 so that shielded conductor 26 extends therebetween. These devices are provided with pads 60, 62 respectively. Device pads 60, 62 may be then connected to pads 52 by any well-known means in the art. In FIG. 3 for example, wires 64 and 66 are bonded to the respective pads as shown using the technique commonly known as wire bonding.

A method of producing a board with a shielded conductor is illustrated in FIGS. 4-8. First a relatively wide metallic strip 68 is deposited on a copper base 20. As shall become apparent below, this first strip shall become the bottom wall of the shield. An appropriate material 70 with low dielectric constant such as polyimide is applied to the base to form a smooth, continuous surface with metallic strip 68. Strip 68 is deposited either directly on base 20, or, as shown in FIGS. 4-8, an insulating layer 69 may be disposed between the base 20 and layer 68 as shown. Next, (FIG. 5) two relatively narrow strips 72, 74 are deposited on strip 68, each strip having an outer edge 76 which is continuous with a corresponding outer edge of strip 68. A shallow channel 78 is thus defined by the strips 68, 72 and 74 as shown. The dielectric is then built up to be even with the top surfaces of strips 72 and 74. Channel 78 is also filled up with dielectric.

Figure 5:
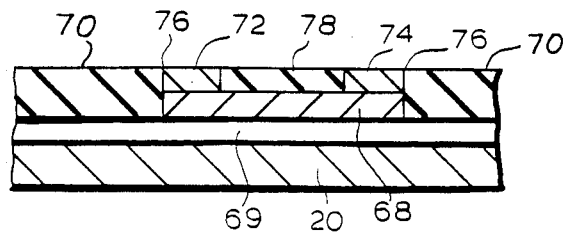
Figure 6:
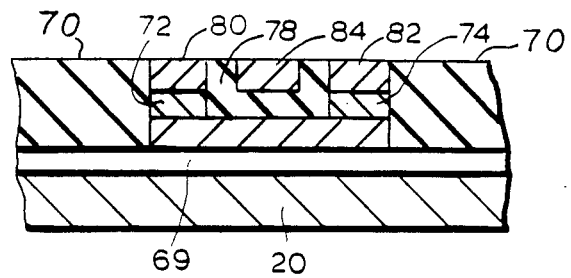

Next, (FIG. 6) three metallic strips are deposited on the assembly of FIG. 5, with two of the strips 80, 82 being disposed in a substantially overlapping position, on top of strips 72, 74 respectively and a third strip 84 being deposited above the channel 78 and evenly spaced from strips 80 and 82. Dielectric is again built up across the width of the assembly and in between strips 80, 84 and 84, 82 respectively.

Figure 7:
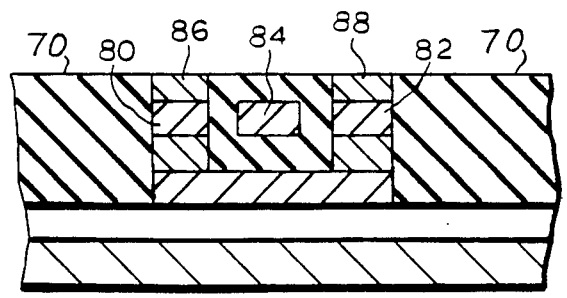
Figure 8:
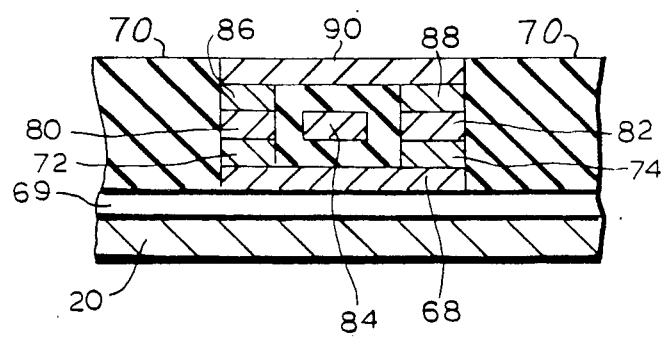

The steps of FIG. 5 are then repeated as shown in FIG. 7 with two additional strips 86, 88 being deposited over strips 80, 82 as shown. The dielectric applied in this step effectively buries the central strip 84 with the shield.

Finally a last, relatively wide metallic strip 90 (FIG. 8) is deposited on top of strips 86, 88 thereby completing the shield around central strip 84 which then may act as a conductor for high frequency signals. For the sake of simplicity the vertical leg 50 and connecting tab 52 have been omitted from these Figures. However obviously they are made by appropriate masking techniques prevalent in the art.

Figure 11:
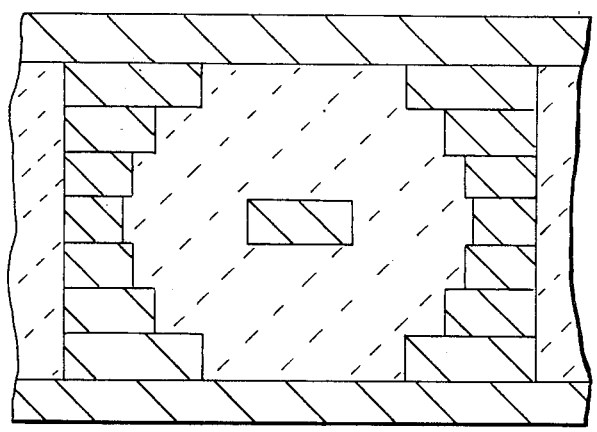
FIG. 11 shows an alternate embodiment of the invention simulating a circular shield.

While in FIGS. 4-8 the formation of a rectangular shield is illustrated, it is clear that the same principles may be used to build shields having other cross-sections such as square, circular, triangular, etc. For example, a simulated circular shield may be made of nine layers as shown in FIG. 11. Furthermore, while a typical rectangular shield with at least five layers are necessary (or four if base forms the bottom wall of the shield), it is obvious that more layers may be used as required by the desired configuration. The technique described above may also be used to make partial shields such as the I-shaped shields 46, 48 or U-shaped shield 44.

Figure 9:
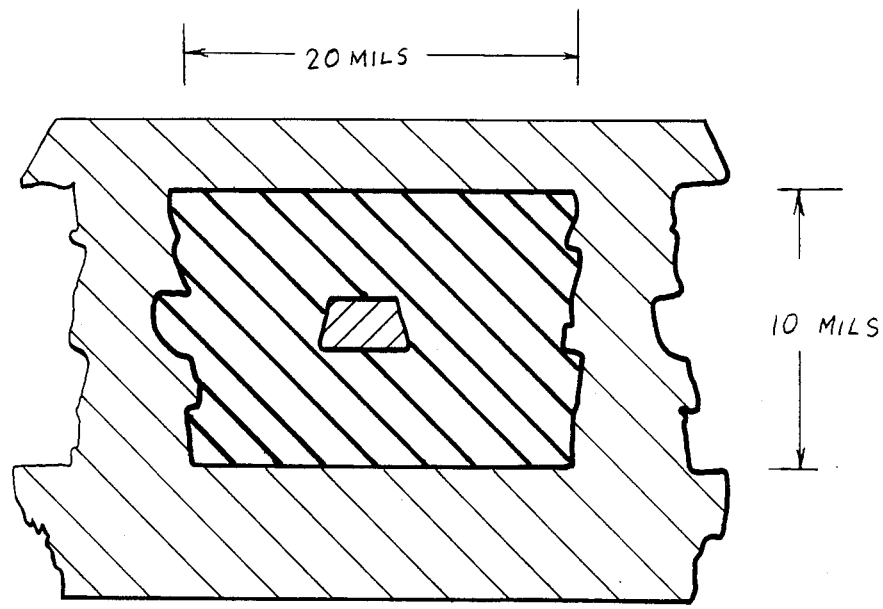
FIG. 9 shows a blow-up sectional view of a shielded conductor imbedded in a board substrate.

In FIGS. 4-8, the successive layers are shown as being perfectly deposited and aligned with the adjacent layers. It is well known that in practice such an alignment is virtually impossible. In FIG. 9, the cross section of an actual shielded conductor made in accordance with the above described method is shown. It can be seen from this Figure that slight misalignment errors between successive layers cause the sidewalls to waiver slightly, however the integrity of the shield is maintained. The cavity within the shield illustrated in FIG. 9 measures 20×10 mils; however, a smaller size cavity may be used.

Figure 10:
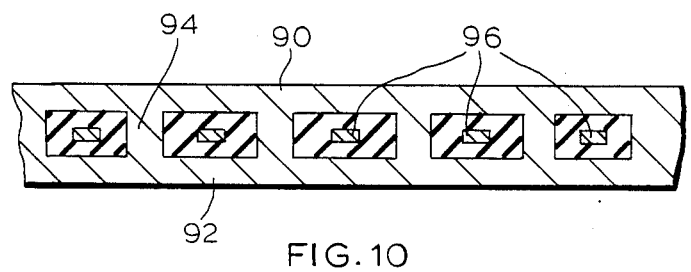
FIG. 10 shows a board having a plurality of parallel conductors, each being individually shielded.

If necessary, a plurality of conductors may be individually shielded as shown in FIG. 10. In this Figure a continuous top 90 and bottom 92 shielding surfaces are formed and the space therebetween is partitioned by side walls 94 extending perpendicularly between these surfaces. Conductors 96 are disposed between walls 94 so that each conductor 96 is individually shielded. One skilled in the art could provide numerous modifications to the present invention without departing from its scope as defined in the appended claims.

I claim:

1. A substrate for supporting electronic components and having a coaxial conductor embedded therein, comprising:
    a base defining a first planar layer;
    a first conductive strip disposed on a portion of said base;
    dielectric material disposed on said base laterally adjacent said first conductive strip and overlying other portions of said base, said first conductive strip and said dielectric material defining a second layer;
    a first pair of spaced elongated conductive strips disposed on said second layer and defining a channel therebetween, each of the pair of conductive strips being in electrical contact with said first conductive strip along the length of said strips;
    dielectric material disposed on said second layer laterally adjacent and also between said conductive strips, thereby filling said channel and overlying portions of the second layer, said first pair of spaced elongated conductive strips and said dielectric material defining a third layer;
    at least three spaced and elongated conductive strips disposed on said third layer, the two outermost of said three spaced conductive strips overlying said first pair of conductive strips and being in electrical contact therewith the third conductive strip being disposed between said two outermost conductive strips and over said channel said third conductive strip forming a conductor of said coaxial conductor;
    dielectric material disposed on said third layer laterally adjacent and also between said conductive strips and overlying portions of the third layer, said three conductive strips and said dielectric material defining a fourth layer;
    a second pair of spaced elongated conductive strips disposed on said fourth layers, each of the second pair of conductive strips being in electrical contact with the outermost two of the three conductive strips of the fourth layer along the length thereof;
    dielectric material disposed on said fourth layer laterally adjacent and also between said second pair of conductive strips and over portions of the fourth layer, said second pair of conductive strips and said dielectric material defining a fifth layer;
    a second conductive strip disposed on said fifth layer overlying said second pair of conductive strips and in electrical contact therewith over the length thereof; and
    dielectric material disposed on said fifth layer laterally adjacent said second conductive strip, said second conductive strip and said dielectric material defining a sixth layer, whereby the the conductive strips of the second and sixth layers, the first and second pair of conductive strips and the two outermost conductive strips in the fourth layer form a shield disposed about and coaxial with the conductor formed by the third conductive strip in the fourth layer, said shield being in contact with said base.

2. A substrate as described in claim 1, wherein said base layer is formed of a conductive material and said shield is in electrical contact therewith.

3. A substrate as described in claim 1, additionally comprising:
    at least one conductive portion formed in said fifth layer in electrical contact with the third conductive strip of the fourth layer, said second conductive strip having an opening formed therein overlying said conductive portion in said fifth layer; and
    a conductive portion formed in said sixth layer overlying and in electrical contact with the conductive portion of the fifth layer and electrically isolated from the second conductive strip, whereby a contact means is provided for connection to the conductor.

4. A substrate as described in claim 1, wherein the first and second pairs of spaced elongated conductive strips and the two outermost of the three spaced conductive strips have equal lengths and the third conductive strip of the three spaced conductive strips has a shorter length, said substrate further comprising:

conductive portions formed in said third, fourth and fifth layers at the ends of said first and second pairs of spaced elongated conductive strips and said two outermost of the three spaced conductive strips, said conductive portions being in electrical contact therewith, said conductive portions being in electrical contact with each other and with said first and second conductive strips, thereby forming end walls for said shield.

5. A substrate as described in claim 4, additionally comprising:

at least two spaced conductive portions formed in said fifth layer in electrical contact with the third conductive strip of the fourth layer adjacent the ends thereof, said second conductive strip having openings formed therein overlying said conductive portions in said fifth layer; and conductive portions formed in said sixth layer overlying and in electrical contact with the conductive portions of the fifth layer and electrically isolated from the second conductive strip, whereby contact means are provided for connection to the conductor at each end thereof.

* * * * *